(12) United States Patent
Negra et al.

(10) Patent No.: US 9,077,391 B2
(45) Date of Patent: Jul. 7, 2015

(54) TRANSMITTER FRONT-END DEVICE FOR GENERATING OUTPUT SIGNALS ON BASIS OF POLYPHASE MODULATION

(71) Applicant: RWTH Aachen, Aachen (DE)

(72) Inventors: Renato Negra, Aachen (DE); Bjorn Thorsten Thiel, Aachen (DE)

(73) Assignee: RWTH AACHEN (DE)

( * ) Notice: Subject to any disclaimer, the term of this patent is extended or adjusted under 35 U.S.C. 154(b) by 0 days.

(21) Appl. No.: 14/360,805

(22) PCT Filed: Dec. 4, 2012

(86) PCT No.: PCT/EP2012/074326
§ 371 (c)(1),
(2) Date: May 27, 2014

(87) PCT Pub. No.: WO2013/083550
PCT Pub. Date: Jun. 13, 2013

(65) Prior Publication Data
US 2014/0328434 A1 Nov. 6, 2014

(30) Foreign Application Priority Data

Dec. 4, 2011 (DE) .......................... 10 2011 119 915

(51) Int. Cl.
H04L 27/20 (2006.01)
H04B 1/00 (2006.01)
H04L 27/36 (2006.01)
H03M 7/30 (2006.01)
H03M 3/00 (2006.01)

(52) U.S. Cl.
CPC .......... *H04B 1/0039* (2013.01); *H04L 27/2053* (2013.01); *H04L 27/362* (2013.01); *H03M 7/3028* (2013.01); *H03M 3/50* (2013.01); *H03M 3/40* (2013.01); *H04L 27/2092* (2013.01)

(58) Field of Classification Search
CPC ........ H04B 1/03; H04L 27/20; H04L 27/362; H03M 3/40
USPC .................................................. 375/295, 308
See application file for complete search history.

(56) References Cited

U.S. PATENT DOCUMENTS

| 2003/0147655 A1* | 8/2003 | Shattil ........................... 398/182 |
| 2004/0192229 A1* | 9/2004 | Morris et al. .................. 455/91 |
| 2015/0029212 A1* | 1/2015 | Chan et al. ..................... 345/597 |

OTHER PUBLICATIONS

Harris et al.: "On Synthesizing High Speed Sigma-Delta DACs by Combining the Outputs of Multiple Low Speed Sigma-Delta DACs", Conference Record of the 36th. Asilomar Conference on Signals, Systems & Computers, Bd. 2, (Nov. 3, 2002), Seiten 1050-1054.

(Continued)

*Primary Examiner* — Jaison Joseph
(74) *Attorney, Agent, or Firm* — Sheridan Ross P.C.

(57) ABSTRACT

The invention relates to a transmitter front-end device for generating output signals representing a digital stream, wherein the device has at least one first input for a first input signal and at least one second input for a second input signal, with the first input signal and the second input signal representing a complex data signal of the digital stream and being intended to influence an output signal of the transmitter front-end device. Furthermore, the transmitter front-end device has at least one phase generation device which generates at least one additional phase signal on the basis of the first input signal and the second input signal, with at least 3 phase signals being outputted by the phase generation device with different phases with respect to each other, at least one modulator that is set up such that it generates a complementary phase signal pair from a received phase signal, with each of the at least 3 phase signals being processed by an associated modulator into a corresponding complementary phase signal pair. Furthermore, the transmitter front-end device has at least one frequency converter that is set up such that it converts phase signals of a complementary phase signal pair with a high-frequency signal in order to form an output signal.

10 Claims, 5 Drawing Sheets

(56) References Cited

OTHER PUBLICATIONS

Ebrahimi et al.: "Time-Interleaved Delta-Sigma Modulator for Wideband Digital GHz Transmitters Design and SDR Applications"; Progress in Electromagnetics Research B, vol. 34, 263-281, 2011.

Shi et al.: "Performance Comparison of RF Class-D Amplifier With Neoteric Modulator and Bandpass Sigma-Delta Modulator"; 2009 IEEE.

International Search Report prepared by the European Patent Office on Feb. 15, 2013, for International Application No. PCT/EP2012/074326.

* cited by examiner

TRANSMITTER FRONT-END DEVICE FOR GENERATING OUTPUT SIGNALS ON BASIS OF POLYPHASE MODULATION

CROSS REFERENCE TO RELATED APPLICATIONS

This application is a national stage application under 35 U.S.C. 371 and claims the benefit of PCT Application No. PCT/EP2012/074326 having an international filing date of Dec. 4, 2012, which designated the United States, which PCT application claimed the benefit of German Patent Application No. 10 2011 119 915.6 filed on Dec. 4, 2011, the disclosure of which are incorporated herein by reference.

The invention relates to a transmitter front-end device for generating output signals on the basis of polyphase modulation.

BACKGROUND OF THE INVENTION

At present, there is a strong trend toward so-called Software Defined Radio (SDR) applications. One contributing factor for this trend is, among other things, that SDR concepts make it possible to dynamically exhaust an available spectrum. However, this trend also requires especially flexible high-frequency transmission devices. What is more, the requirements are on the rise, since it is increasingly the case that several spectra and/or several radio standards need to be made available by the high-frequency transmission device. For instance, modern telephones, laptops and tablet PCs contain various different radio systems with different modulation schemes and/or different bandwidths and/or different frequencies. Some noteworthy examples of so-called near-field communication are LTE (Long Term Evolution), 3G (3rd-generation mobile telecommunication network), WiMAX (Worldwide Interoperability for Microwave Access), Wireless LAN or Bluetooth.

At the same time, however, the demands for energy efficiency, both in the mobile devices and in the respective base stations, are on the rise as well. The energy efficiency of mobile devices is an important criterion for maximizing operating time, whereas the energy efficiency of base stations has both a direct influence on the so-called OPEX (Operation Expenditure) and an indirect influence through the thermal losses to be cooled.

However, these demands are difficult to reconcile, since the complexity increases through the provision of the widest variety of transmission systems and as a result of reconfigurability, which generally results in increased power loss, while energy efficiency must not decrease, but increase substantially.

Furthermore, it should be pointed out that the increasing networking of digital device and the multitude of radio systems have also led to a trend toward increased digitalizing of the high-frequency transmission device itself. This development is promoted by the thus enabled increased speed and lower power consumption as the structures of the CMOS processes shrink. As a result, a desired reconfigurability in so-called "digital centric transmitter"-based solutions can be made possible through adaptation of digital settings for filters and cores. However, this approach, which thus leads the digital signals closer to the antenna, raises the question of where in the transmission chain the digital input signal is to be converted into an analog signal.

The use of so-called "switching-mode power amplifiers" (SMPAs), also called switching amplifiers, makes it possible to meet the demands for increased reconfigurability as well as greater energy efficiency. This is possible because these amplifiers can achieve a very high level of efficiency that theoretically lies at 100%. In addition, these amplifiers require only one driving signal, whereby digital signals can be used up to the amplifier. A very wide variety of methods can be used to generate a digital signal that represents an analog signal that can be restored through filtering. One possible method is delta-sigma modulation ($\Delta\Sigma$ modulation/DS modulation). In $\Delta\Sigma$ modulation, an analog or even a multi-level digital signal is converted into a one-bit stream while the in-band quantization noise is reduced through noise-shaping.

The main concept of $\Delta\Sigma$ modulation is the shifting of the quantization noise to a frequency range that lies outside of the frequency band being used. To this end, the difference between a quantized input signal y[n] and the quantized output signal v[n] is calculated as an error signal e[n]. This error signal is filtered by means of a transfer function H(z) and returned to the input of the quantizer. On the basis of its defined characteristic, the transfer function H(z) of the filter now ensures that the quantization noise is shifted into a range outside of the useful range. The order of the $\Delta\Sigma$ modulator is determined here by the order of the filter H(z). In order to meet the spectral requirements, the output signal must generally be filtered in order to remove this noise. Filters meeting stringent requirements must oftentimes be used for this.

$\Delta\Sigma$ modulators can essentially be categorized into three groups, namely so-called bandpass (BP), high-pass (HP) and low-pass (LP) $\Delta\Sigma$ modulators, with the type of noise filtering being characteristic for the group.

Depending on the type of $\Delta\Sigma$ modulator used, different things must be considered.

Bandpass $\Delta\Sigma$Ms (BP$\Delta\Sigma$Ms/BPDSMs) operate at frequencies that are higher than the carrier frequencies. Furthermore, a multitude of switching operations are necessary during a carrier period. However, due to the multitude of transitions from saturation to cutoff and back, the high number of switching operations can have a negative impact on energy efficiency, since switching-related losses now come to bear more strongly. What is more, the demands placed on processing speed cannot be met without further provisions, so this speaks against the use of BPDSMs in the gigahertz range and above.

High-pass $\Delta\Sigma$Ms (HP$\Delta\Sigma$Ms/HPDSMs) require operating frequencies that are at least twice as high as the required carrier frequency, for which reason the limitations of BPDSMs essentially apply here as well.

In contrast, low-pass $\Delta\Sigma$Ms (LP$\Delta\Sigma$Ms/LPDSMs) do not require the use of frequencies that are higher than the required carrier frequency. Consequently, LPDSMs can be used by means of common methods including, for example, by means of field-programmable gate array (FPGA). It should be pointed out, however, that LP$\Delta\Sigma$Ms have a higher noise level outside of the useful band than HP$\Delta\Sigma$M or BP$\Delta\Sigma$M for low operating frequencies (and, as a result, low oversampling), with the latter operating at higher frequencies. The case often arises that the noise signal occurs near the desired signal. That is the case particularly with signals having a large bandwidth.

In view of this situation, it is the object of the invention to provide a novel transmitter front-end device which makes it possible to exhibit an improved noise profile even at low operating frequencies of the DSM.

The object is achieved by a transmitter front-end device according to claim 1. Further advantageous embodiments particularly constitute the subject matter of the dependent claims.

Below, the invention is explained in further detail with reference to the figures.

Figure 1:
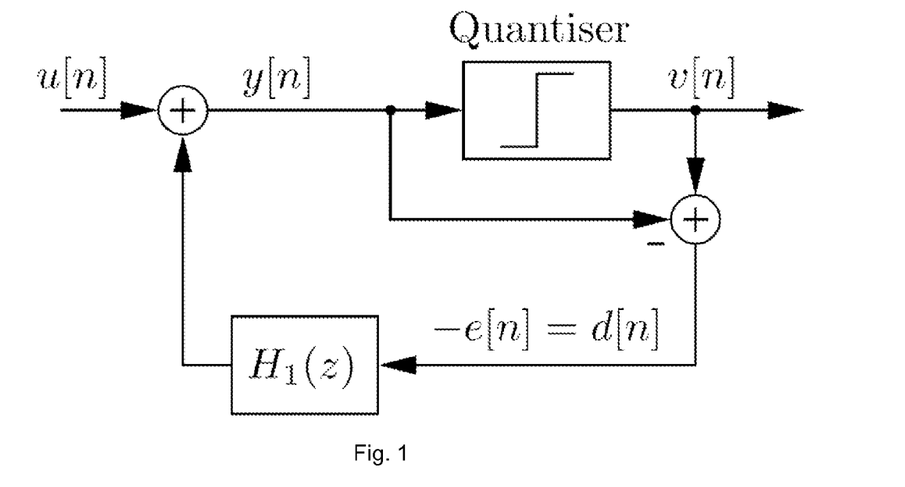
FIG. 1 shows a schematic view of a DSM.
Figure 2:
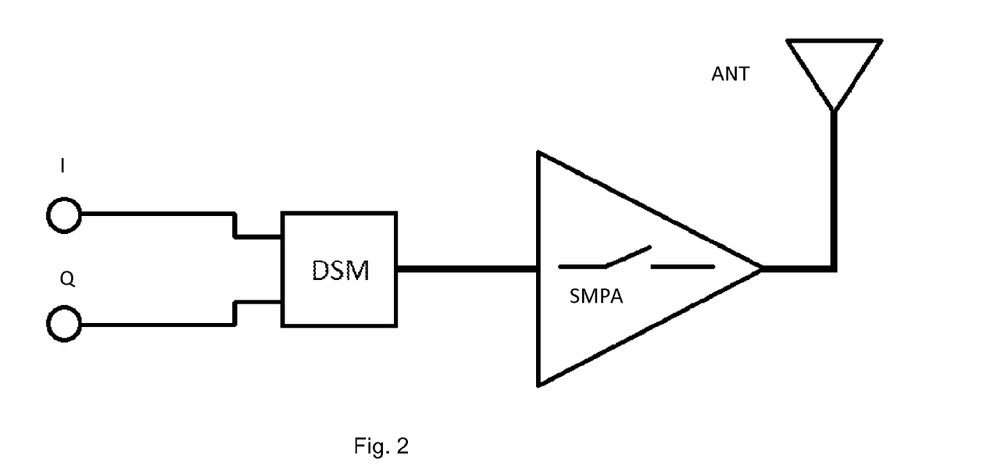
FIG. 2 shows a schematic view of a DSM concept according to the prior art.
Figure 5:
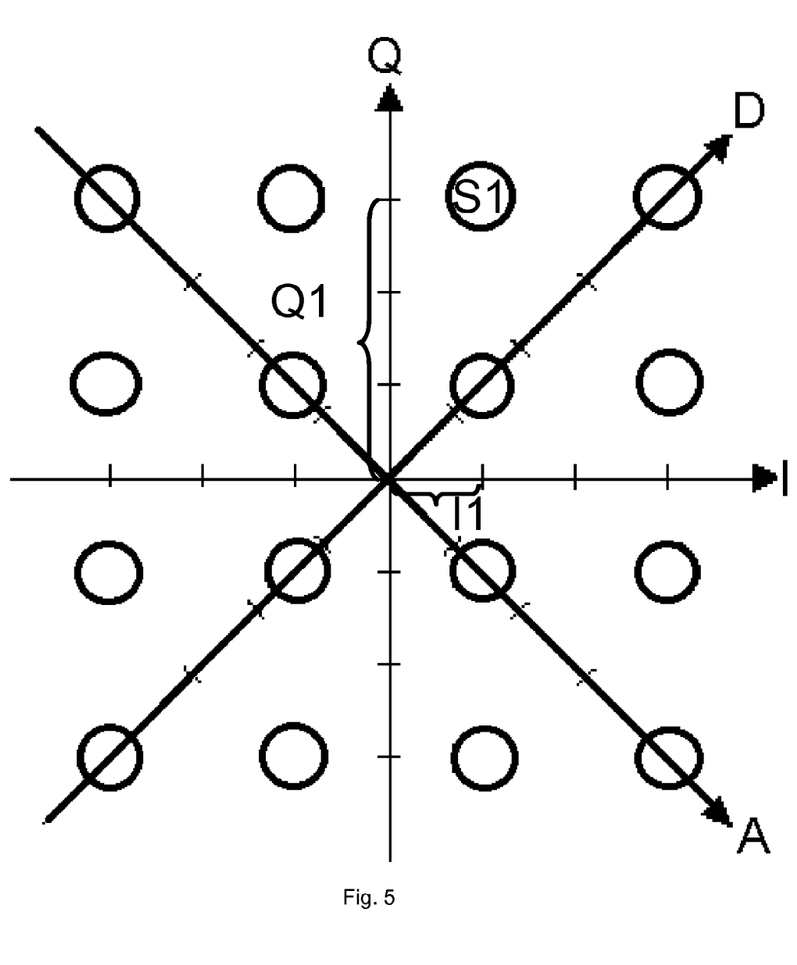
FIG. 5 shows a schematic view of a digital signal space.

FIG. 2 shows a DSM concept according to the prior art. There, in-phase signals I and quadrature phase signals Q are obtained from a DSM that correspond to signal points. Signal points of this type are shown in FIG. 5. There, reference is made to a signal point S1 by the in-phase signal I1 and a quadrature phase signal Q1. The one-bit stream is available at the output of the DSM and is made available to the switching amplifier. The amplified signal is now fed to the antenna ANT in order to be emitted.

Figure 3:
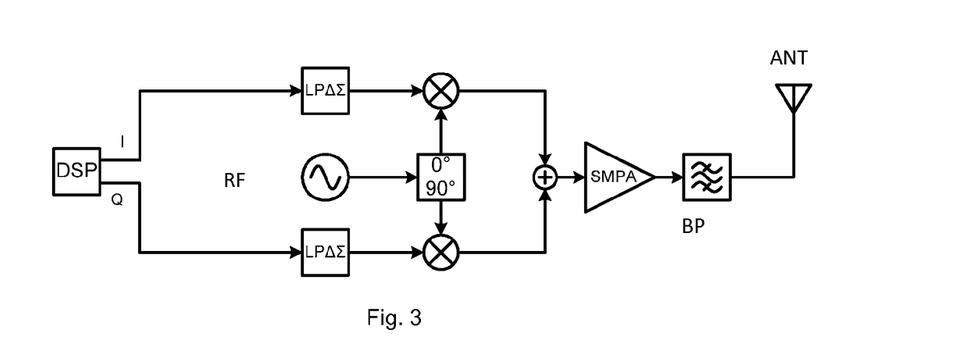
FIG. 3 shows a more detailed schematic view of a DSM concept according to the prior art.

FIG. 3 shows a detailed schematic illustration of a DSM concept according to the prior art. There, the in-phase signals I and quadrature phase signals Q are generated by a digital signal processor DSP and then fed to an independent low-pass DSM LPΔΣ. The signals are then converted with a high-frequency signal RF that is phase-shifted by 90° with respect to one of the two signals (shown at the Q-signal). The respective signals received from this conversion are brought together in a suitable device, which is designated with +, and then made available to the switching amplifier SMPA. The amplified signal is now converted via a bandpass filter BP into the analog or continuous-time domain and fed to the antenna ANT in order to be emitted.

Figure 4:
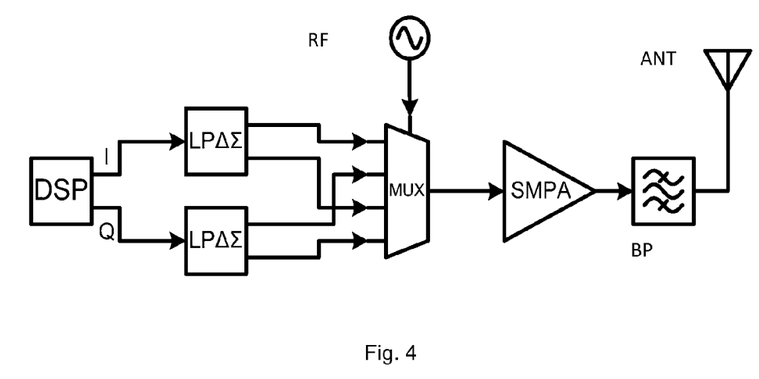
FIG. 4 shows a more detailed schematic view of a DSM concept according to the prior art.

This concept is shown in even further detail in FIG. 4. There, a complementary phase signal pair is generated by the LPΔΣ modulators. Then the signals are converted with a high-frequency signal RF. The respective signals received from this conversion are also brought together in a suitable device, which is designated with MUX, and then made available to the switching amplifier SMPA. The amplified signal is now converted via a bandpass filter BP to the analog domain and fed to the antenna ANT in order to be emitted.

Figure 6:
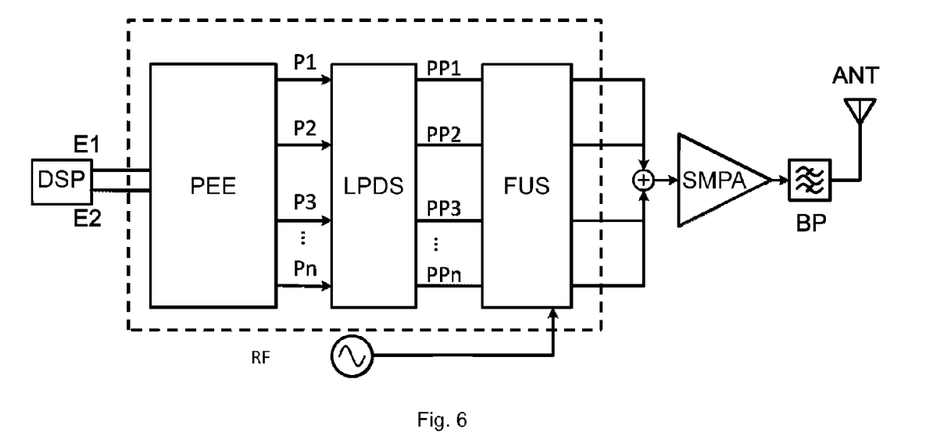
FIG. 6 shows a schematic view of a DSM concept according to embodiments of the invention.

Exemplary embodiments according to the invention will be described below in further detail with reference to FIGS. 6 to 8.

The inventive exemplary embodiments of the transmitter front-end device for generating output signals, which represent a digital stream, have at least one first input E1 for a first input signal and at least one input E2 for a second input signal, with the first input signal and the second input signal representing a complex data signal of the digital stream and being intended to influence an output signal of the transmitter front-end device.

Here, the input signals can have, for example, an in-phase signal I and a quadrature phase signal Q, or an amplitude signal A and a phase signal phi, or a suitable combination thereof, such as I, Q, and phi.

Furthermore, the transmitter front-end device has at least one phase generation device PEE which, on the basis of the first input signal E1 and of the second input signal E2, generates at least one other phase signal P1, P2, P3, . . . Pn, with at least 3 phase signals P1, P2, P3, . . . Pn being outputted by the phase generation device with different phases with respect to each other.

Thus, for instance, it is possible to generate two other phase signals P1 and P2 from an I and a Q signal that are phase-shifted with respect to the I signal by +120° or −120°, while P3 corresponds to the I signal. Other variants are explained below in further detail.

Moreover, the transmitter front-end device has at least one suitable modulator LPDS which is set up such that it generates a complementary phase signal pair PP1, PP2, PP3, . . . PPn from a received phase signal P1, P2, P3, . . . Pn. One possible suitable modulator is a delta-sigma or a neoteric modulator.

Depending on the operating speed available, parallel processing of all received signals P1, P2, P3, . . . Pn can be performed by an equal number of individually allocated delta-sigma modulators, or all of the received phase signals P1, P2, P3, . . . Pn are processed sequentially by a modulator, in which case the modulator is a time-allocated modulator for each of the phase signals as a result of its sequential mode of operation. Furthermore, a so-called polyphase modulator, a group of coupled modulators in which the feedback and filtering of all phases is combined, is also possible. As will readily be understood, mixed forms of these cases can also be provided.

Each of the at least 3 phase signals P1, P2, P3, . . . Pn is thus processed by an associated modulator into a corresponding complementary phase signal pair PP1, PP2, PP3, . . . PPn.

Furthermore, the transmitter front-end device has at least one frequency converter FUS that is set up such that it converts phase signals of a complementary phase signal pair PP1, PP2, PP3, . . . PPn with a high-frequency signal RF in order to form an output signal.

The output signals can then be brought together in a suitable device, which is designated with +, and then made available to the switching amplifier or also to a saturated amplifier SMPA. The conversion and merging can also be performed in one step, for example by means of a suitable multiplexer or a shift register. The amplified signal is now converted via a bandpass filter BP into the analog or continuous-time domain and fed to the antenna ANT in order to be emitted.

The frequency converter FUS and the merging device + result together in the function of a serializer, which is to say a serial, one-bit stream is generated again from a plurality of received parallel output signals from the sigma-delta converters.

In other words, in stark contrast to previous LP-DSM concepts, as shown in FIGS. 2 to 4 for the sake of example, 3 or more phase components are fed to associated modulators in the system according to the invention.

Figure 7:
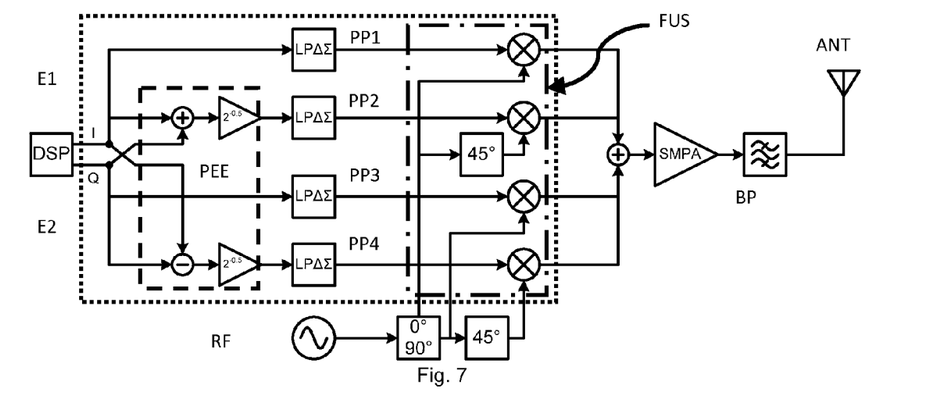
FIG. 7 shows a schematic view of a DSM concept according to embodiments of the invention.

In an exemplary embodiment that is shown in FIG. 7, an in-phase signal I is fed to the first input and a quadrature phase signal Q is fed to the second input E2. The in-phase signal I and the quadrature phase signal 2 yield additional phase signals P2 and P4. The phase signal P1 corresponds to the in-phase signal I, while the phase signal P3 corresponds to the quadrature phase signal Q.

The phase signal P2 is obtained through the addition of the in-phase signal I and of the quadrature phase signal Q. The phase signal P4 is obtained from the difference of the in-phase signal I and the quadrature phase signal Q. The phase signal P2, hereinafter also called diagonal signal D, corresponds to the D-axis in FIG. 5, while the phase signal P4, hereinafter also called antidiagonal signal A, corresponds to the A-axis in FIG. 5. In order to bring the amplitudes of the phase signals P2 and P4 in line again with the phase signals, they are weighted. In the present case, the phase signals P2 and P4 are each weighted with the factor of $1/\sqrt{2}$. The phase signals P1, P2, P3, P4 have different phases with respect to each other.

Furthermore, the transmitter front-end device has at least one delta-sigma modulator LPΔΣ that is set up such that it generates a complementary phase signal pair PP1, PP2, PP3, PP4 from a received phase signal P1, P2, P3, P4. FIG. 7 shows that an exemplary delta-sigma modulator LPΔΣ is provided for each phase signal. Of course, other configurations can also be used, as explained previously.

Each of the 4 phase signals P1, P2, P3, P4 is thus processed by an associated delta-sigma modulator into a corresponding complementary phase signal pair PP1, PP2, PP3, PP4.

Furthermore, the transmitter front-end device has at least one frequency converter FUS that is set up such that it converts phase signals of a complementary phase signal pair PP1, PP2, PP3, PP4 with a high-frequency signal RF in order to form an output signal. In this process, the phase signal P2 (A) is converted with the high-frequency signal RF with a phase shift of 45° with respect to P1 (I). The phase signal P3 (Q) is converted with a phase shift of 90° with respect to P1 (I). The phase signal P4 (D) is converted with a phase shift of 135° with respect to P1 (I).

The output signals can then be merged in a suitable device, which is designated with +, and then made available to the switching amplifier or also to the saturated amplifier SMPA. The amplified signal is now converted via a bandpass filter BP into the analog or continuous-time domain and fed to the antenna ANT in order to be emitted.

The combination of frequency converter FUS and merging device + have the function of a serializer, which is to say that a serial, one-bit stream is generated again from a plurality of received parallel output signals from the delta-sigma modulator.

Figure 8:
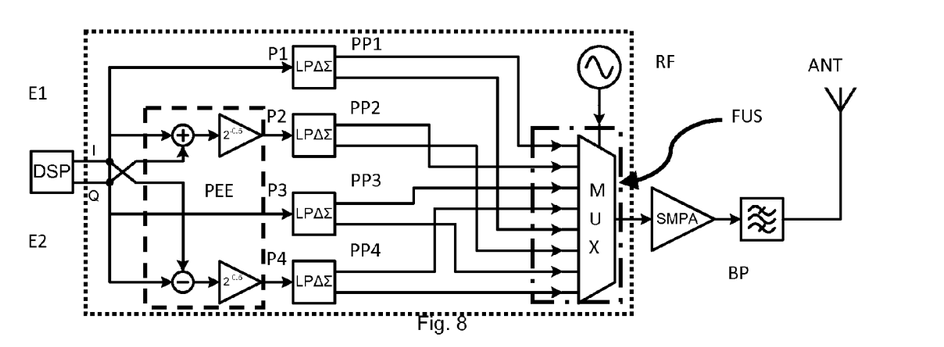
FIG. 8 shows a schematic view of a DSM concept according to embodiments of the invention.

FIG. 8 shows another exemplary embodiment. In it, an in-phase signal I is fed to the first input E1, and a quadrature phase signal Q is fed to the second input E2. The in-phase signal I and the quadrature phase signal yield 2 additional phase signals P2 and P4. The phase signal P1 corresponds to the in-phase signal I, whereas the phase signal P3 corresponds to the quadrature phase signal Q.

The phase signal P2 is obtained through the addition of the in-phase signal I and the quadrature phase signal Q. The phase signal P4 is obtained from the difference of the in-phase signal I and the quadrature phase signal Q. The phase signal P2, hereinafter also called diagonal signal D, corresponds to the D-axis in FIG. 5, whereas the phase signal P4, hereinafter also called antidiagonal signal A, corresponds to the A-axis in FIG. 5. In order to bring the amplitudes of the phase signals P2 and P4 in line again with the phase signals, they are weighted. In the present case, the phase signals P2 and P4 are each weighted with the factor of $1/\sqrt{2}$. The phase signals P1, P2, P3, P4 have different phases with respect to each other.

Furthermore, the transmitter front-end device has at least one exemplary delta-sigma modulator LPΔΣ that is set up such that it generates a complementary phase signal pair PP1, PP2, PP3, PP4 from the received phase signal P1, P2, P3, P4. FIG. 8 shows that a delta-sigma modulator LPΔΣ is provided for each phase signal. Of course, other configurations can also be used, as explained previously.

Each of the 4 phase signals P1, P2, P3, P4 is thus processed by an associated delta-sigma modulator into a corresponding complementary phase signal pair PP1, PP2, PP3, PP4.

Furthermore, the transmitter front-end device has at least one frequency converter FUS that is set up such that it converts phase signals of a complementary phase signal pair PP1, PP2, PP3, PP4 with a high-frequency signal RF in order to form an output signal. In this process, the phase signal P2 (A) is converted with the high-frequency signal RF with a phase shift of 45° with respect to P1 (I). The phase signal P3 (Q) is converted with a phase shift of 90° with respect to P1 (I). The phase signal P4 (D) is converted with a phase shift of 135° with respect to P1 (I).

The output signals can then be merged in a conventional manner in a suitable device, which is designated in this case as MUX and embodied as a component of the frequency converter FUS, and then made available to the switching amplifier SMPA. The amplified signal is now converted via a bandpass filter BP to the analog domain and fed to the antenna ANT in order to be emitted.

The component designated with MUX has the function of a serializer, which is to say that it generates a serial, one-bit stream again from a plurality of received parallel output signals from the frequency converter FUS.

Through the generation of two additional phase signals, it is now possible to increase the time resolution. As a result, the signal-noise ratio is substantially improved compared to the previously known embodiments according to FIGS. 2 to 4.

In the embodiments according to FIGS. 7 and 8, the previous sequence IQĪQ̄, which is applied to the input of the frequency conversion FUS, is expanded, for example to the sequence IDQĀĪD̄QA. In this way, the invention makes it possible to exploit the advantages of low-pass delta-sigma modulators with their lower signal processing speed requirements and to improve the signal-noise ratio, thus even enabling implementation in FPGA.

For demonstration purposes, a signal generation DSP, ΔΣ modulators and upconversion were implemented in an FPGA. At the same time, for the sake of comparison, a conventional design as shown in FIG. 4 was implemented, as well as a design according to the invention as shown in FIG. 7. As the input signal, a complex single sideband signal with adjustable frequency $f_{st}$ was generated, where $I=\sin(2\pi f_{st}t)$ and $Q=\cos(2\pi f_{st}t)$. In order to achieve maximum speed, the DDS core available on the FPGA was used, as a result of which a maximum clock frequency of 400 MHz can be achieved in the given example. In this case, the additional phase signals P2, P4, or D and A can be generated under the use of a "pipelined combined adder/multiplier block," so that the clock frequency of 400 MHz can also be achieved. A first-order low-pass delta-sigma modulator with a three-stage output was selected as the ΔΣM topology. The three output levels were implemented by having the output signals v for I and Q and their complementary signals v̄ for Ī and Q̄ be controlled individually. In this way, an effective resolution of the delta-sigma modulator of 1.5 bits was achieved. In order to optimize the calculation, the error signal e was generated directly from the "least significant bits," here from sig-2 to 0 combined with the signum bit of the ΔΣ input word y. This error signal $e = y_{sig}, y_{sig-2 \ldots 0}$ is then added to the input in the next clock cycle. The output signal now follows from the signum and the "most significant bit," here sig-1, to $v = \neg y_{sig} \wedge y_{sig-1}$ and $\bar{v} = y_{sig} \wedge \neg y_{sig-1}$. This simplified calculation enables calculation at the maximum clock frequency. The following upconversion is prepared by a RocketIO transceiver, which makes available a parallel byte sequence in a serial bit stream with a sampling frequency of $f_{ser}$=3.2 GHz in this case. The input byte stream can thus be picked up as a digital polyphase baseband signal, with the input byte representing one cycle of the carrier frequency and the phase angle between two bits being $$\Delta\Phi = \frac{\pi}{4} = 45°.$$

This results in a carrier frequency $$f_c = \frac{\Delta\Phi}{2\pi} f_{ser} = 400 \text{ MHz}.$$

When implemented on a high-frequency switching circuit, the serializer can have its own design. For instance, as shown in FIG. 8, it is possible to use a multiplexer MUX that is controlled, for example, by means of a delay loop and can thus be used as a high-speed serializer, thus enabling carrier frequencies even in the gigahertz range.

Although input signals were cited very generally in the foregoing, it will readily be understood that the transmitter front-end device according to the embodiments of the invention can, in principle, also process analog signals. Likewise, it is possible to also process signals with a higher digital resolution, in any case at least digitally binary signals.

Although phase signals and ternary phase signals were cited very generally in the foregoing, it will readily be understood that the transmitter front-end device according to the embodiments of the invention can also generate phase signals of binary form or higher resolution.

Although delta-sigma modulators were described above for the sake of example, other modulators which generate a phase signal with substantially constant amplitude from the input signal are also [possible], with additional signals being added to the input signal such that they come to lie in commensurate alignment with the desired frequency band and can thus be easily filtered out at the system output. Another example of such a type of modulator is a neoteric modulator.

In general, a provision is made that the phase relationship of adjacent different phases is equal. Accordingly, the phase relationship in the embodiments according to FIGS. 7 and 8 is such that each of P2 to P1, P3 to P2, and P4 to P3 is phase-shifted by 45°. However, other phase relationships are not excluded by the invention.

Figure 9:
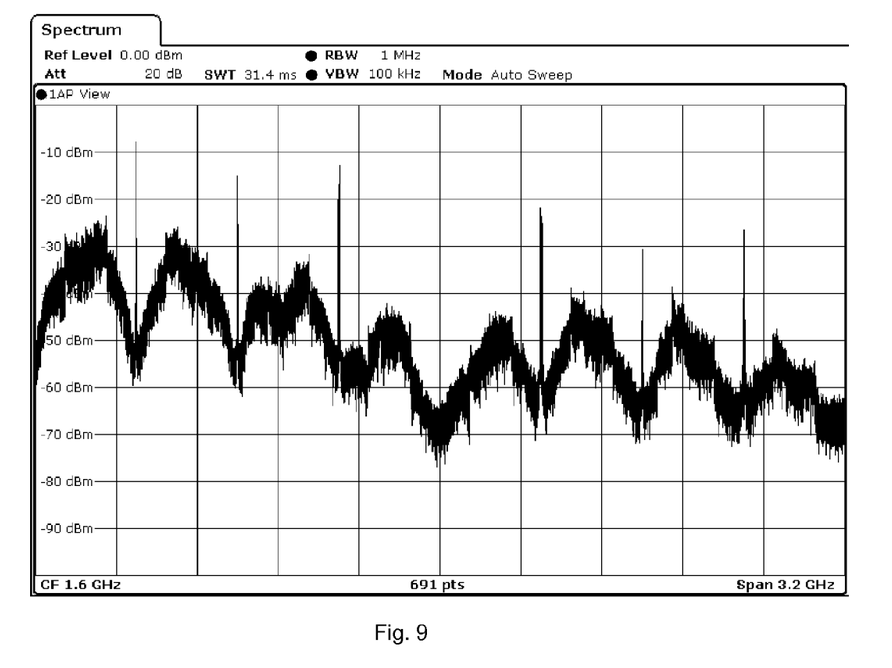
FIG. 9 shows measurements for a DSM concept according to the prior art.
Figure 10:
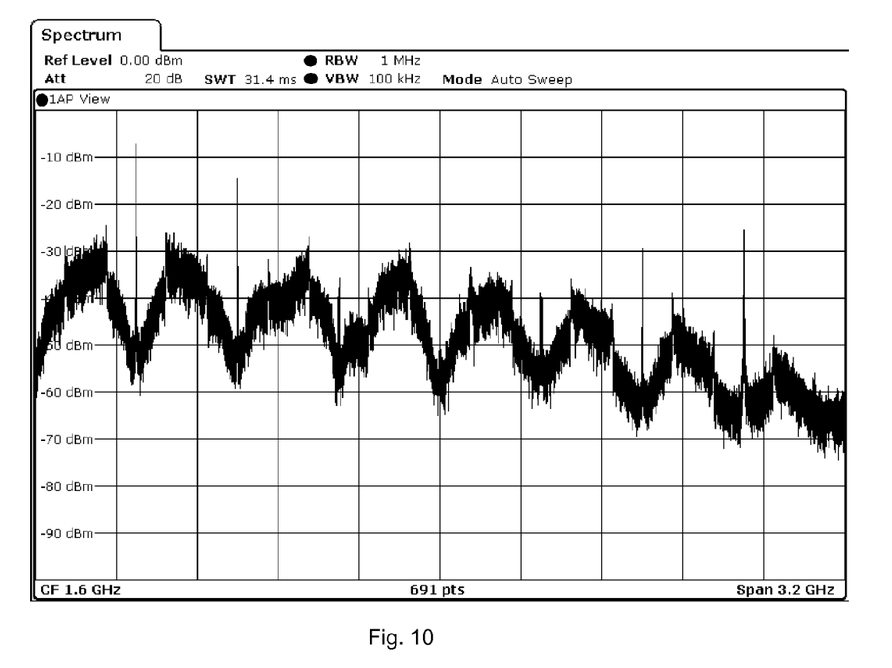
FIG. 10 shows measurements for a DSM concept according to embodiments of the invention.

Finally, exemplary measurements will be presented below which prove the feasibility of the invention on the basis of the exemplary implementation described above. Here, the operating frequency of the $\Delta\Sigma$M is set at 400 MHz. This frequency is also the carrier frequency of the serializer. The frequency of the complex single sideband signal was set at a low frequency of 1 kHz in order to prevent digital resampling artifacts. FIG. 10 shows the broadband spectrum of the four-phase front end according to FIG. 8. In comparison to that, FIG. 9 shows the broadband spectrum of a conventional approach with the same input signal according to FIGS. 2 to 4. It becomes clear here that noise in the 1.6 GHz range was shifted, so that the noise is distributed more uniformly above the carrier frequency than in FIG. 9.

Figure 11:
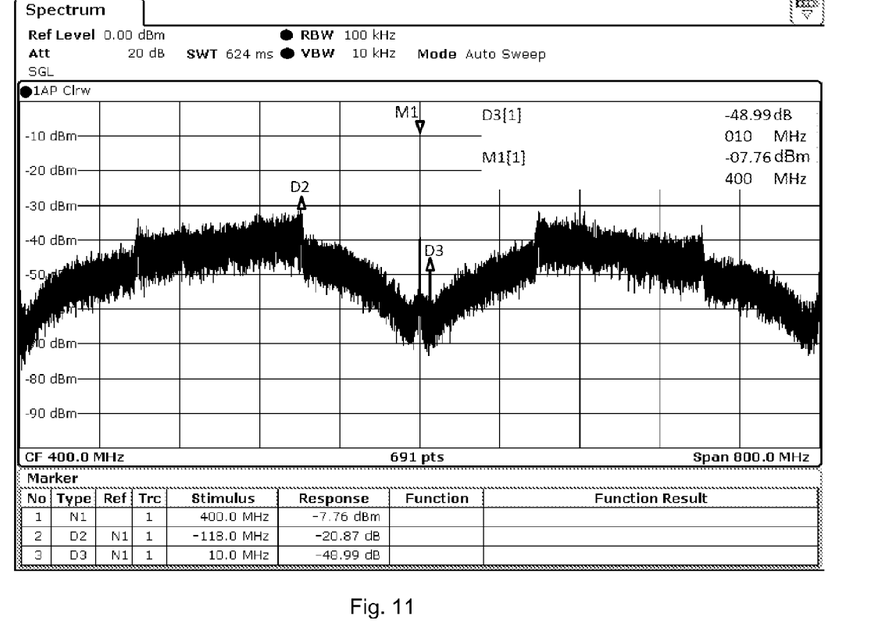
FIG. 11 shows more detailed measurements for a DSM concept according to the prior art.
Figure 12:
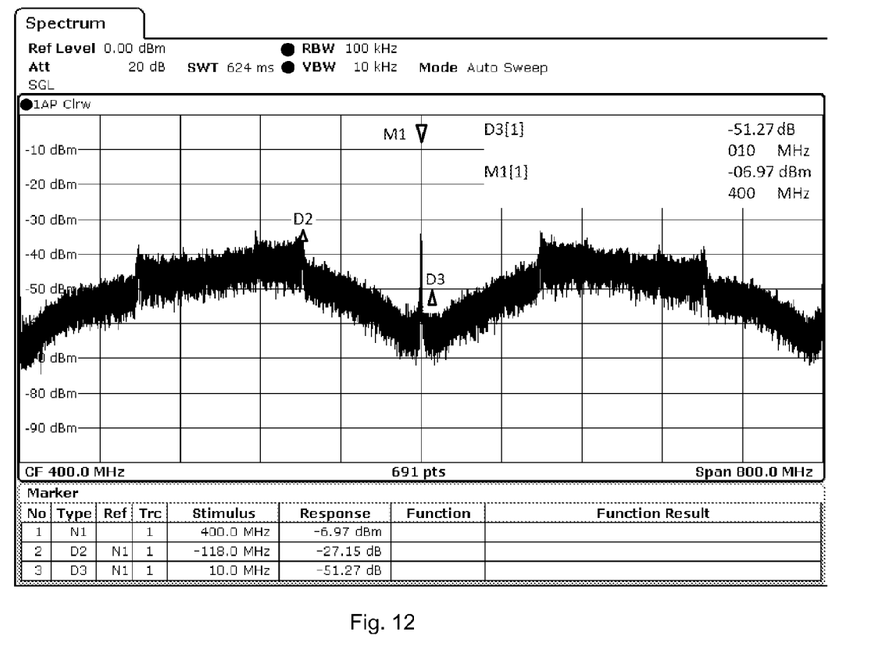
FIG. 12 shows more detailed measurements for a DSM concept according to embodiments of the invention.

FIGS. 11 and 12 show more detailed measurements. Once again, FIG. 11 shows the conventional approach, while FIG. 12 shows the inventive approach. The improved noise suppression is revealed here. With a shift of about 118 MHz, the maximum noise is reduced by 6 dB. The signal-to-noise ratio measured at 10 MHz shift to the desired signal, which is designated in FIGS. 11 and 13 with D3, was improved by 3 dB. Moreover, the arrangement being presented also makes it possible to increase the signal output by about 1 dB compared to the conventional approach.

As a result, it is clear that the inventive arrangement being presented [meets?] the requirements of demonstrating an improved noise profile even at low operating frequencies of the DSM.

The invention claimed is:

1. A transmitter front-end device for generating output signals, which constitute a digital stream, wherein the device has:
    at least one first input for a first input signal and at least one second input for a second input signal, with the first input signal and the second input signal representing a complex data signal of the digital stream and being intended to influence an output signal of the transmitter front-end device,
    at least one phase generation device which generates at least one additional phase signal on the basis of the first input signal and of the second input signal, with at least 3 phase signals being outputted from the phase generation device with different phases with respect to each other,
    at least one modulator that is set up such that it generates a complementary phase signal pair from a received phase signal,
    with each of the at least 3 phase signals being processed into a corresponding complementary phase signal pair by an associated modulator,
    at least one frequency converter that is set up such that it converts the frequency of phase signals of a complementary phase signal pair in order to form an output signal.

2. The transmitter front-end device as set forth in claim 1, wherein the first input signal and the second input signal are at least digitally binary.

3. The transmitter front-end device as set forth in claim 1, wherein the generated phase signals are at least digitally binary.

4. The transmitter front-end device as set forth in claim 1, wherein the phase relationship of adjacent different phases is equal.

5. The transmitter front-end device as set forth in claim 1, wherein a phase generation device is provided for each phase signal.

6. The transmitter front-end device as set forth in claim 1, wherein the phase generation device generates at least two additional phases from the in-phase signal and the quadrature phase signal, with one of the generated phases being based on the sum of the in-phase signal and the quadrature phase signal, and with the other of the generated phases being based on the difference of the in-phase signal and the quadrature phase signal.

7. The transmitter front-end device as set forth in claim 1, wherein a frequency converter is provided at least for each phase signal pair.

8. The transmitter front-end device as set forth in claim 1, wherein the generated output signals are merged in a combiner into an output signal to be transmitted.

9. The transmitter front-end device as set forth in claim 1, wherein each of the phase signal pairs has a ternary format.

10. The transmitter front-end device as set forth in claim 1, wherein the modulator is a delta-sigma modulator or a neoteric modulator.

* * * * *